(12) United States Patent  
Prodan

(10) Patent No.: US 9,325,350 B2  
(45) Date of Patent: Apr. 26, 2016

(54) MULTIPLE SIZE AND RATE FORWARD ERROR CORRECTION (FEC) CODE COMBINATION WITH MINIMUM SHORTENING AND MAXIMUM COMBINED CODE RATE

(71) Applicant: BROADCOM CORPORATION, Irvine, CA (US)

(72) Inventor: Richard Stephen Prodan, Niwot, CO (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/949,348

(22) Filed: Nov. 23, 2015

(65) Prior Publication Data

US 2016/0080001 A1    Mar. 17, 2016

Related U.S. Application Data

(63) Continuation of application No. 14/273,264, filed on May 8, 2014, now Pat. No. 9,203,435.

(60) Provisional application No. 61/820,941, filed on May 8, 2013.

(51) Int. Cl.
| | |
|---|---|
| *H03M 13/00* | (2006.01) |
| *H03M 13/29* | (2006.01) |
| *H04L 5/00* | (2006.01) |

(52) U.S. Cl.  
CPC ............. *H03M 13/29* (2013.01); *H04L 5/0007* (2013.01)

(58) Field of Classification Search  
CPC ............. H04L 15/0007; H03M 13/29; H03M 13/2778; H03M 13/116; H03M 13/635; H03M 13/27  
See application file for complete search history.

(56) References Cited

U.S. PATENT DOCUMENTS

| | | | | |
|---|---|---|---|---|
| 7,916,775 | B2 * | 3/2011 | Kim ...................... | H04L 1/1621 370/278 |
| 8,064,330 | B2 * | 11/2011 | Kandukuri Narayan ................ | H04B 1/707 370/210 |
| 2013/0107985 | A1 * | 5/2013 | Jang .................... | H03M 13/136 375/295 |

* cited by examiner

*Primary Examiner* — Christine Tu  
(74) *Attorney, Agent, or Firm* — Garlick & Markison; Shayne X. Short

(57) ABSTRACT

A communication device is configured to encode information bits using one or more forward error correction (FEC) codes and/or error correction codes (ECCs) to generate different codewords (e.g., codeword groups having different lengths, based on different code rates, etc.). The device generates a combined codeword using different sized codewords (e.g., long, medium, and short) by filling fills long codewords completely if possible, then filling medium codewords completely if possible with the remaining message bits (if any), and filling short codewords completely if possible plus another additional short codeword with the remaining message bits (if any). If the total number of short (or medium and short) codeword parity bits is greater than or equal to the number of medium (or long) codeword parity bits, then the device increments the number of medium (or long) codewords by one and setting the number of short (or medium and short) codewords to zero.

20 Claims, 9 Drawing Sheets

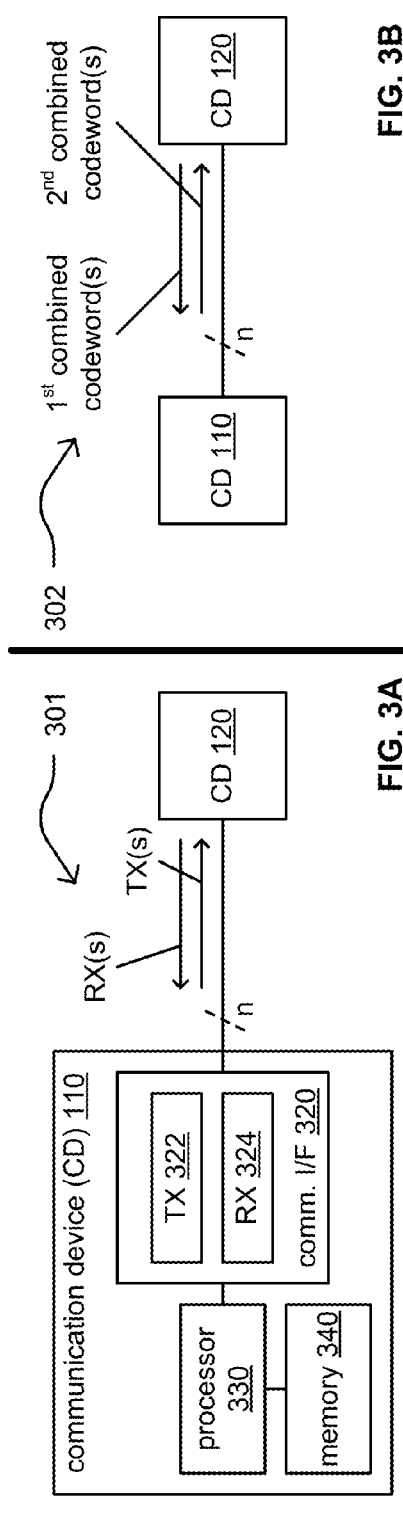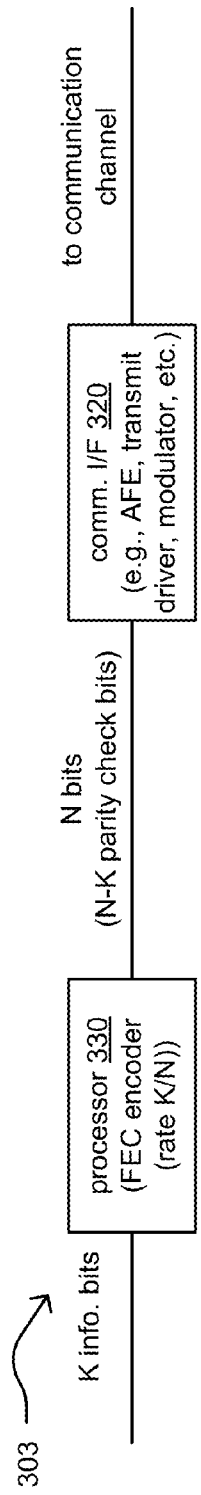

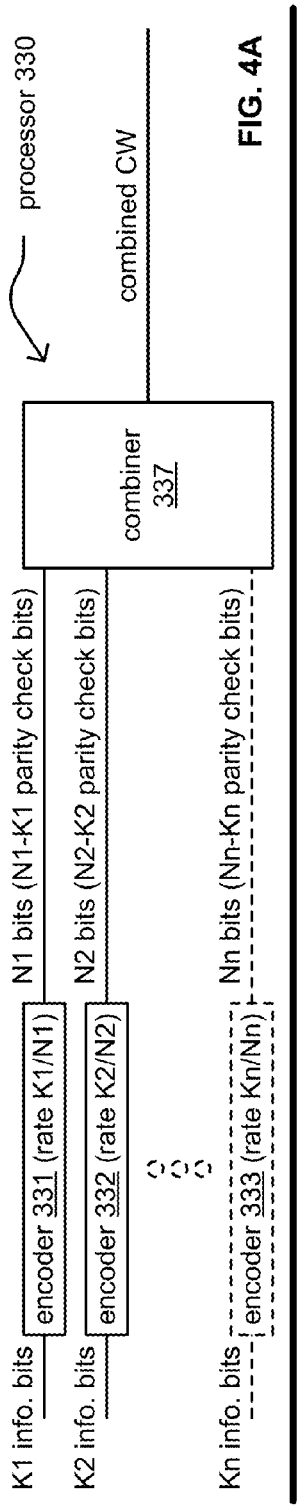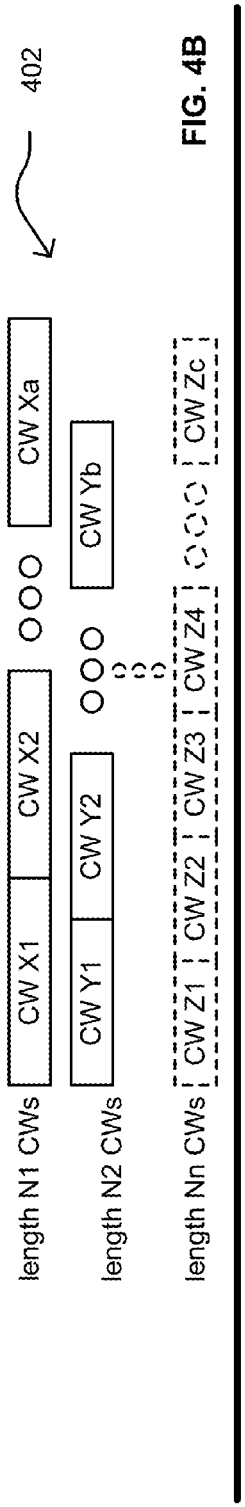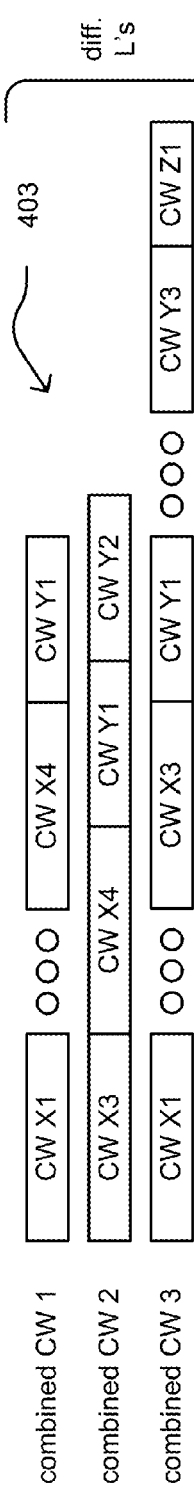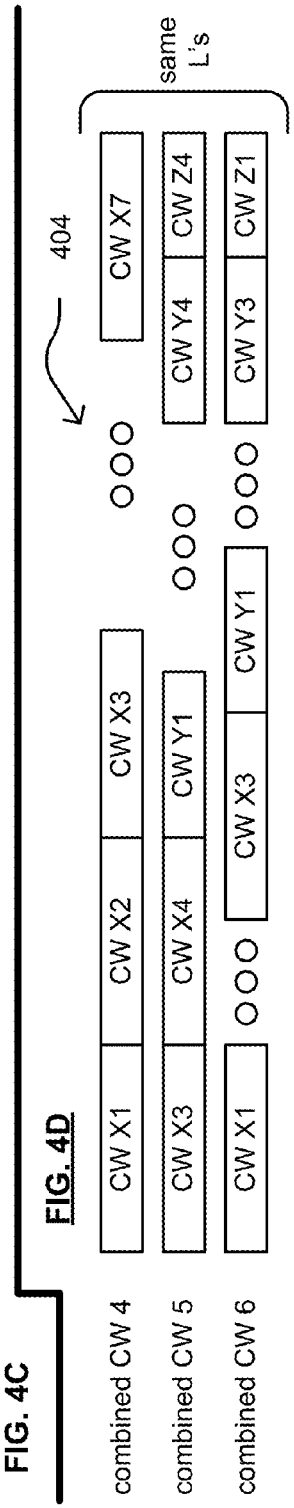

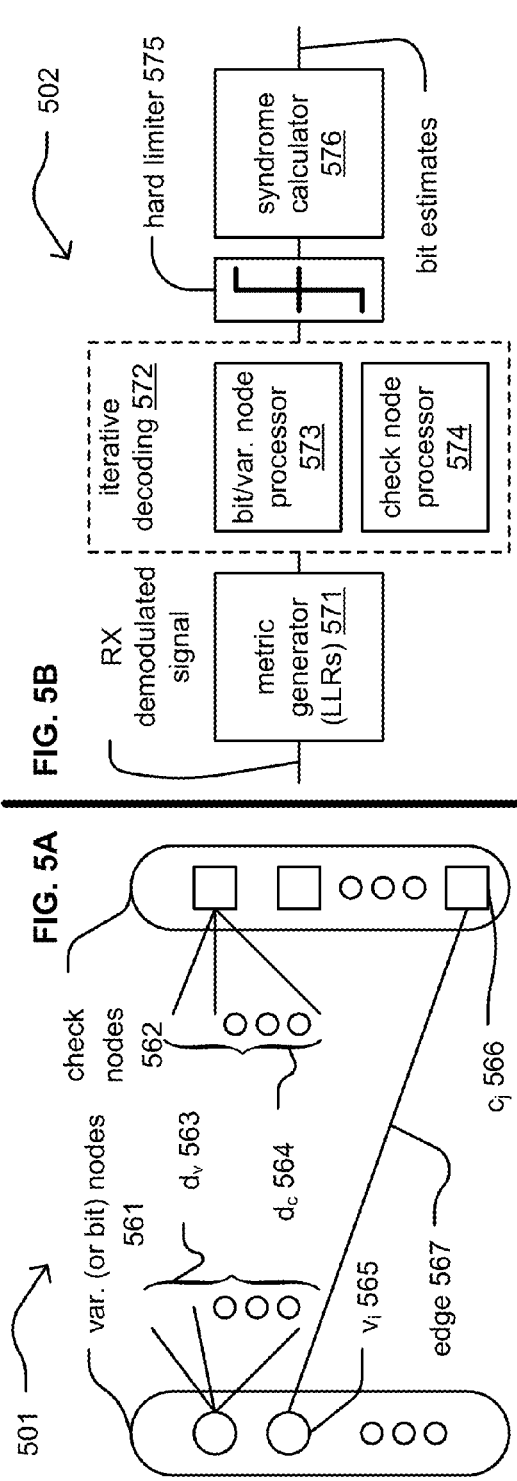
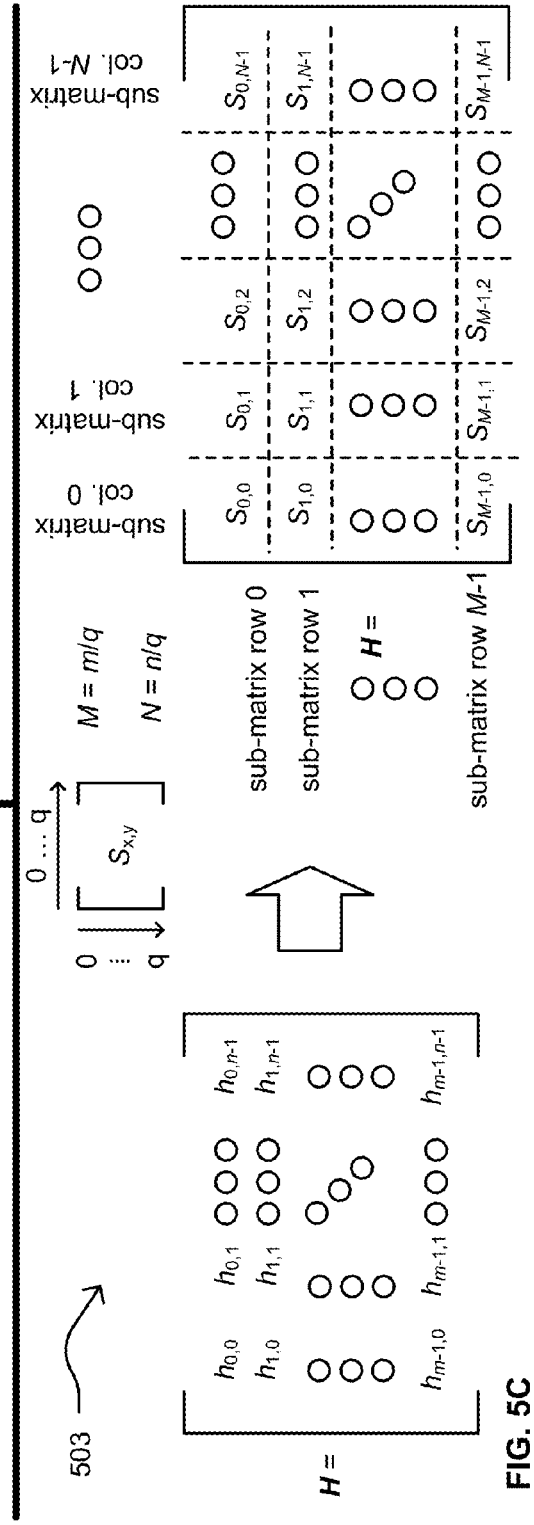

MULTIPLE SIZE AND RATE FORWARD ERROR CORRECTION (FEC) CODE COMBINATION WITH MINIMUM SHORTENING AND MAXIMUM COMBINED CODE RATE

CROSS REFERENCE TO RELATED PATENTS/PATENT APPLICATIONS

The present U.S. Utility Patent Application claims priority pursuant to 35 U.S.C. §120 as a continuation of U.S. Utility application Ser. No. 14/273,264, entitled "Multiple size and rate FEC code combination with minimum shortening and maximum combined code rate," filed May 8, 2014, and scheduled subsequently to be issued as U.S. Pat. No. 9,203, 435 on Dec. 1, 2015 (as indicated in an ISSUE NOTIFICATION mailed from the USPTO on Nov. 11, 2015), which claims priority pursuant to 35 U.S.C. §119(e) to U.S. Provisional Application No. 61/820,941, entitled "Multiple size and rate forward error correction (FEC) code combination with minimum shortening and maximum combined code rate," filed May 8, 2013, both of which are hereby incorporated herein by reference in their entirety and made part of the present U.S. Utility Patent Application for all purposes.

BACKGROUND

1. Technical Field

The present disclosure relates generally to communication systems; and, more particularly, to forward error correction (FEC) and/or error correction code (ECC) coding within such communication systems.

2. Description of Related Art

Data communication systems have been under continual development for many years. The primary goal within such communication systems is to transmit information successfully between devices. Unfortunately, many things can deleteriously affect signals transmitted within such systems resulting in degradation of or even complete failure of communication. Examples of adverse effects include interference and noise that may be caused by various sources including other communications, low-quality links, degraded or corrupted interfaces and connectors, etc.

Some communication systems use forward error correction (FEC) coding or error correction code (ECC) coding to increase the amount of information that may be transmitted between devices. When a signal incurs one or more errors during transmission, a receiver device can employ the FEC or ECC coding to try to correct those one or more errors.

A continual and primary directive in this area of development has been to try continually to lower the SNR required to achieve a given bit error ratio (BER) or symbol error ratio (SER) within a communication system. The Shannon limit is the theoretical bound for channel capacity for a given modulation and code rate. The ideal goal has been to try to reach Shannon's channel capacity limit in a communication channel. Shannon's limit may be viewed as being the data rate per unit of bandwidth (i.e., spectral efficiency) to be used in a communication channel, having a particular signal to noise ratio (SNR), where transmission through the communication channel with arbitrarily low BER or SER is achievable.

Within the context of communication systems that employ one or more types of FEC or ECC coding, there continues to be much room for improvement related to better designed codes that provide for better performance (e.g., lower BER or SER for a given SNR). Also, a given application may operate more effectively with FEC or ECC coding particularly tailored for that application. One FEC or ECC code or a combination of multiple such codes may be more effective or efficient in one application as compared to another.

BRIEF DESCRIPTION OF THE SEVERAL VIEWS OF THE DRAWINGS

FIG. 3A is a diagram illustrating a communication device operative within one or more communication systems.

FIG. 3B is a diagram illustrating an example of operation of communication devices.

FIG. 3C is a diagram illustrating an example of forward error correction (FEC) encoding and transmit signal generation.

FIG. 3D is a diagram illustrating an example of signal demodulation and FEC decoding.

FIG. 4A is a diagram illustrating an example of combination of multiple size, Ni, and rate, Ki/Ni, forward error correction (FEC) codewords to generate a combined codeword.

FIG. 4B is a diagram illustrating an example of codewords of different sizes and rate FECs.

FIG. 4C is a diagram illustrating an example of different combined codewords of different overall lengths (diff. L's).

FIG. 4D is a diagram illustrating an example of different combined codewords of a common or same overall length (same L's).

FIG. 5A illustrates an example of an LDPC (Low Density Parity Check) code bipartite graph.

FIG. 5B illustrates an example of decoding of an LDPC coded signal.

FIG. 5C illustrates an example of an LDPC matrix that is partitioned into sub-matrices.

FIG. 6A is a diagram illustrating an example of an LDPC matrix partitioned into a left hand side matrix and a right hand side matrix.

FIG. 6B is a diagram illustrating examples of right hand side matrices of LDPC matrices.

FIG. 6C is a diagram illustrating an example of a communication device configured to perform bit filling, LDPC encoding, shortening, and puncturing.

DETAILED DESCRIPTION

Figure 1:
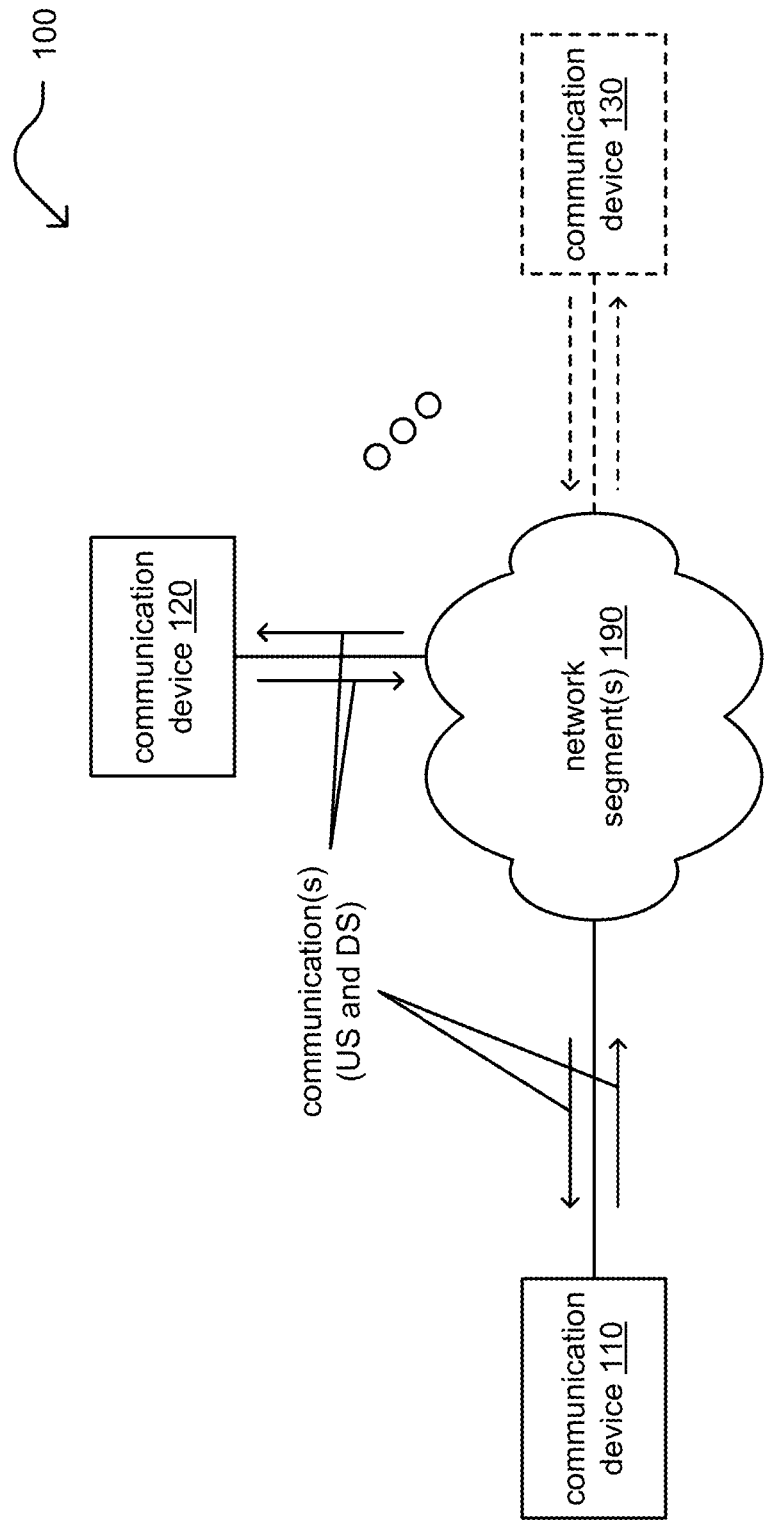
FIG. 1 is a diagram illustrating an embodiment of one or more communication systems.

FIG. 1 is a diagram illustrating an embodiment 100 of one or more communication systems. One or more network segments 190 provide communication inter-connectivity for at least two communication devices 110 and 120 (also referred to as CDs in certain locations in the diagrams). Note that general reference to a communication device may be made generally herein using the term 'device' (e.g., device 110 or CD 110 when referring to communication device 110, or devices 110 and 120, or CDs 110 and 120, when referring to communication devices 110 and 120). Generally speaking, any desired number of communication devices are included within one or more communication systems (e.g., as shown by communication device 130).

The various communication links within the one or more network segments 190 may be implemented using any of a variety of communication media including communication links implemented as wireless, wired, optical (e.g., including fiber-optic), satellite, microwave, etc. Also, in some instances, communication links of different types may cooperatively form a connection pathway between any two devices. Considering one possible example, a communication pathway between devices 110 and 120 may include some segments of wired communication links and other segments of optical communication links. Note also that devices 110-130 may be of a variety of types of devices including stationary devices, mobile devices, portable devices, etc. and may support communications for any of a number of services or service flows including data, telephony, television, Internet, media, synchronization, etc.

Generally speaking, any desired number of devices are included within one or more communication systems (e.g., as shown by device 130). Some or all the various devices 110-130 include capability to generate one or more error correction code (ECC) and/or forward error correction (FEC) coded signals for transmission to another one of devices 110-130 and to receive and interpret such ECC and/or FEC coded signals received from another one of devices 110-130.

In an example of operation, device 110 includes a processor to generate one or more signals for transmission to the other devices 120-130 via a communication interface and to interpret or more signals received from any of the other devices 110-130 via the communication interface. This communication may be bidirectional/to and from the one or more of the other devices 120-130 or unidirectional (or primarily unidirectional) from the one or more of the other devices 120-130.

In another example of operation, device 110's processor is configured to encode first information bits using first forward error correction (FEC) that generates first number of parity bits based on a first code rate to generate first codewords. Device 110's processor is also configured to encode second information bits using second FEC that generates second number of parity bits based on a second code rate to generate second codewords. In one example of operation, each of the first codewords has first codeword size (e.g., all of these first codewords has a first common size), and each of the second codewords has second codeword size (e.g., all of these second codewords has a second common size). Based on at least some of these first and second codewords, device 110's processor is configured to generate a combined codeword that maximizes a combined code rate that is based on the first and second code rates and that minimizes a total number of parity bits within the second subset of the first codewords and the subset of the second codewords. Device 110's processor is also configured transmit the first or second combined codeword to another device (e.g., one or more of the other devices 120-130) via a communication interface of device 110.

In another example of operation, device 110's processor is configured combine one or more of the first codewords and one or more of the second codewords based on the total number of parity bits in the resultant combined codeword. For example, such considerations may be determined 'a priori' or offline and direct comparison of the total number of parity bits in a resultant combined codeword may be used to determine the particular combination by which one or more of the first and second codewords are combined. This information may be stored in a memory of the device 110, or alternatively in some other storage device (e.g., a look up table (LUT), a hard disk drive (HDD), etc.), and device 110's processor is then configured to retrieve this information directly to determine the manner by which the one or more of the first and second codewords are combined. As an example, when the total number of parity bits in one possible resultant combined codeword are above a first threshold and lower than a second threshold, a first combination of one or more of the first and second codewords are combined to generate a resultant combined codeword. Alternatively, when the total number of parity bits in the possible resultant combined codeword are above the second threshold and lower than a third threshold, a second combination of one or more of the first and second codewords are combined to generate the resultant combined codeword.

Note also, in other modes of operation, device's 110 processor is configured to generate different combined codewords that do not have the predetermined size (e.g., a first combined codeword may have a first size, a second combined codeword may have a second size, etc.). Also, in some operational modes, device 110's processor is configured to perform combination of at least some of these first and second codewords as a function of one or more characteristics of the first and second codewords and the FECs used to generate those first and second codewords (e.g., one or more of code rate, block length, structure of low density parity check (LDPC) matrix of such FECs, use of such signals such as for ranging, control, data and/or management, etc.).

Figure 2:
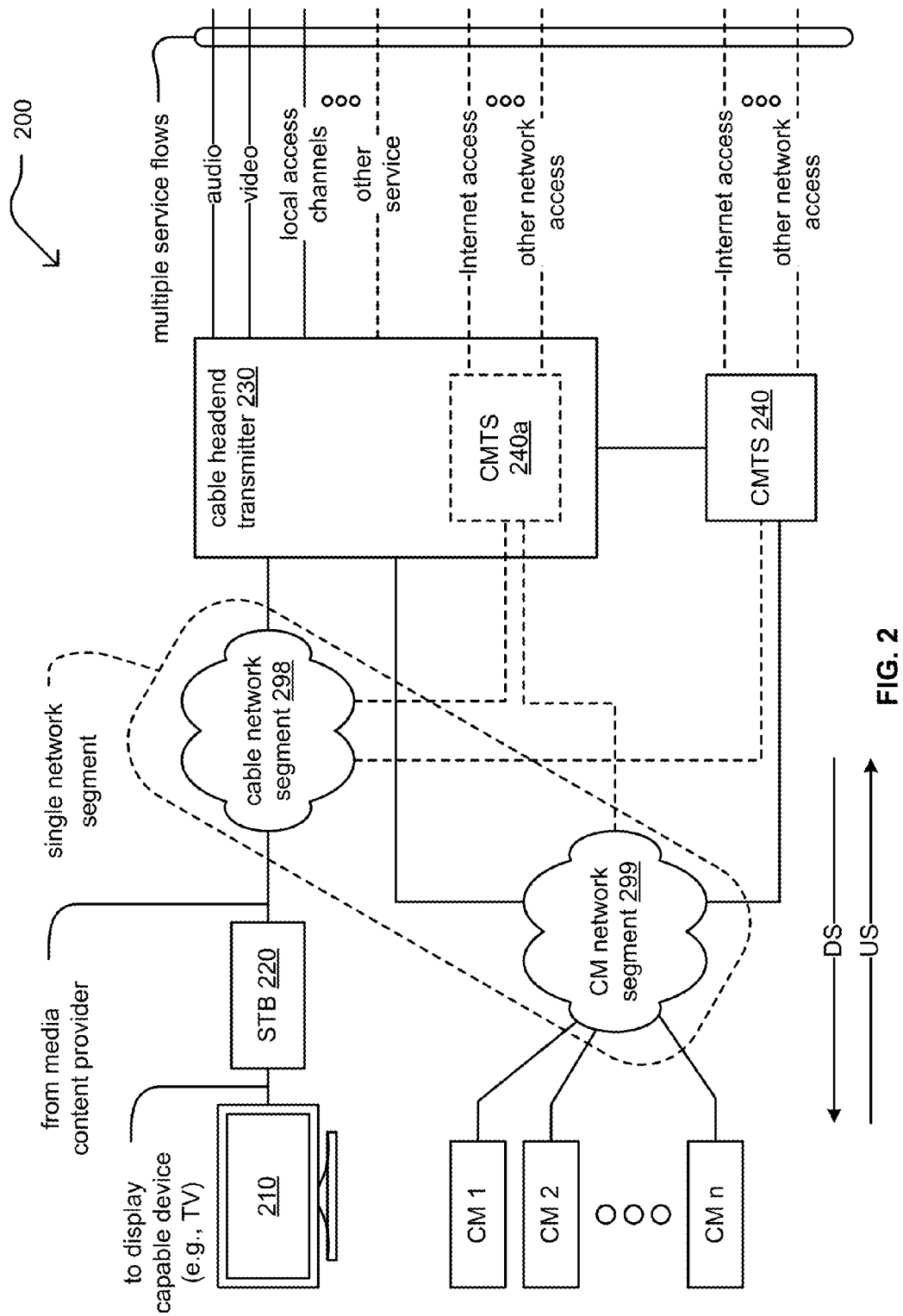
FIG. 2 is a diagram illustrating another embodiment of one or more communication systems.

FIG. 2 is a diagram illustrating another embodiment 200 of one or more communication systems. A cable headend transmitter 230 provides service to a set-top box (STB) 220 via cable network segment 298. The STB 220 provides output to a display capable device 210. The cable headend transmitter 230 can support any of a number of service flows such as audio, video, local access channels, as well as any other service of cable systems. For example, the cable headend transmitter 230 can provide media (e.g., video and/or audio) to the display capable device.

The cable headend transmitter 230 may provide operation of a cable modem termination system (CMTS) 240*a*. For example, the cable headend transmitter 230 may perform such CMTS functionality, or a CMTS may be implemented separately from the cable headend transmitter 230 (e.g., as shown by reference numeral 240). The CMTS 240 can provide network service (e.g., Internet, other network access, etc.) to any number of cable modems (shown as CM 1, CM 2, and up to CM n) via a cable modem (CM) network segment 299. The cable network segment 298 and the CM network segment 299 may be part of a common network or common networks. The cable modem network segment 299 couples the cable modems 1-*n* to the CMTS (shown as 240 or 240*a*). Such a cable system (e.g., cable network segment 298 and/or CM network segment 299) may generally be referred to as a cable plant and may be implemented, at least in part, as a hybrid fiber-coaxial (HFC) network (e.g., including various wired and/or optical fiber communication segments, light sources, light or photo detection components, etc.).

A CMTS 240 (or 240*a*) is a component that exchanges digital signals with cable modems 1-*n* on the cable modem network segment 299. Each of the cable modems is coupled to the cable modem network segment 299, and a number of elements may be included within the cable modem network segment 299. Routers, splitters, couplers, relays, and amplifiers may be contained within the cable modem network segment 299. Generally speaking, downstream information may be viewed as that which flows from the CMTS 240 to the connected cable modems (e.g., CM 1, CM2, etc.), and upstream information is that which flows from the cable modems to the CMTS 240.

Any devices in embodiment 200 (e.g., CMs 1-n, cable headend transmitter 230, CMTS 240a, and/or CMTS 240) may include functionality to generate and process combined codewords transmitted from and received by the various devices. For example, any devices in embodiment 200 may be configured to include a communication interface to support communications with any of the other devices and also include a processor to generate various such combined codewords composed of one or more of the first and second codewords.

In an example of operation of embodiment 200, CM 1 includes a processor that encodes first information bits using FEC that generates first number of parity bits based on a first code rate to generate first codewords. CM 1's processor encodes second information bits using second FEC that generates second number of parity bits based on a second code rate to generate second codewords. Based on at least some of these first and second codewords, CM 1's processor generates first combined codeword that has a predetermined size using first subset of the first codewords when the predetermined size is a positive integer multiple of the first codeword size. CM 1's processor generates second combined codeword when the predetermined size is not a positive integer multiple of the first codeword size. In one mode of operation, the second combined codeword has the predetermined size (e.g., same size as the first combined codeword) and includes second subset of the first codewords and subset of the second codewords that maximizes a combined code rate that is based on the first and second code rates and that minimizes a total number of parity bits within the second subset of the first codewords and the subset of the second codewords. In another mode of operation, the second combined codeword is of different size than the first combined codeword. CM 1's processor is also configured transmit the first or second combined codeword to another device (e.g., one or more of the other devices CMs 2-n, cable headend transmitter 230, CMTS 240a, and/or CMTS 240) via a communication interface of CM 1.

FIG. 3A is a diagram 301 illustrating a communication device (CD) 110 operative within one or more communication systems. Device 110 includes a communication interface 320 and a processor 330. The communication interface 320 includes functionality of a transmitter 322 and a receiver 324 to support communications with one or more other devices within a communication system (e.g., including transmission of signals (TX(s)) to CD 120 and receipt of signals (RX(s)) from CD 120). Device 110 may also include memory 340 to store information including one or more signals generated by device 110 or such information received from other devices (e.g., device 120) via one or more communication channels. Memory 340 may also include and store various operational instructions for use by the processor 330 in regards to the processing of codewords, combined codewords, messages and/or other received signals and generation of such signals and/or other signals including those described herein. The communication interface 320 supports communications to and from one or more other devices (e.g., CD 120). Memory 340 may also include and store information related to characteristics associated with various operations to perform encoding of information bits using various FECs to generate different codewords, information used to perform various combinations of one or more of first and second codewords (generated using first and second FECs) to generate the resultant combined codeword (e.g., optionally including one or more thresholds used for comparison of parity bits to determine the manner by which the one or more of first and second codewords are combined), information used to transmit various signals to other devices in the system (e.g., bit rate, data rate, modulation coding set (MCS), signaling scheme, etc.).

In an example of operation, processor 330 encodes first information bits using FEC that generates first number of parity bits based on a first code rate to generate first codewords, wherein each of the first codewords has first codeword size. Processor 330 encodes second information bits using second FEC that generates second number of parity bits based on a second code rate to generate second codewords, wherein each of the second codewords has second codeword size that is less than the first codeword size. Processor 330 encodes third information bits using second FEC that generates third number of parity bits based on a third code rate to generate third codewords, wherein each of the third codewords has third codeword size that is less than the second codeword size.

Processor 330 generates a combined codeword using three separate sized codewords: long, medium, and short. Processor 330 fills long codewords completely if possible. Then, processor 330 fills medium codewords completely if possible with the remaining message bits (if any). Then, processor 330 fills short codewords completely if possible plus another additional short codeword with the remaining message bits (if any).

If the total number of short codeword parity bits is greater than or equal to the number of medium codeword parity bits, then processor 330 increments the number of medium codewords by one and setting the number of short codewords to zero (e.g., the combined codeword then includes none of the short codewords).

If the total number of medium codeword parity bits plus the total number of short codeword parity bits is greater or equal to than the number of long codeword parity bits, then processor 330 increments the number of long codewords, C1, by one and setting the number of medium and short codewords to zero (e.g., the combined codeword then includes none of the short codewords)).

FIG. 3B is a diagram illustrating an example 302 of operation of communication devices. Device 110 supports communications to and from one or more other devices, such as device 120. Device 110 transmits first one or more combined codewords to device 120. Device 110 receives second one or more combined codewords from device 120. Processor 330 also includes capability to process and interpret these second one or more combined codewords received from device 120 including making estimates of information bits encoded within combined codewords as well as interpreting those estimates of information bits as may be used to adjust or modify operation of device 110 within the one or more communication systems.

FIG. 3C is a diagram illustrating an example 303 of forward error correction (FEC) encoding and transmit signal generation. In this example 303, processor 330 encodes information bits using one or more FECs to generate codewords. In this example 303, processor 330 performs encoding of one or more bits to generate one or more coded bits used to generate the modulation data (or generally, data). Processor 330 performs FEC and/or error correction code (ECC) of one or more bits to generate one or more coded bits. Examples of FEC code and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, etc. The one or more coded bits may then undergo modulation or symbol mapping to generate modulation symbols. The modulation symbols may include data intended for one or more recipient devices. Note that such modulation symbol may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.).

Processor 330 may be configured to transmit modulation symbols via sub-carriers. Processor 330 may use orthogonal frequency division multiplexing (OFDM) and/or orthogonal frequency division multiple access (OFDMA) modulation by performing simultaneous transmission of a large number of narrowband carriers (or multi-tones). OFDMA is a multi-user version of the OFDM digital modulation scheme. Multiple access is achieved in OFDMA by assigning subsets of sub-carriers to individual recipient devices or users. For example, first sub-carrier(s)/tone(s) may be assigned to a user 1, second sub-carrier(s)/tone(s) may be assigned to a user 2, and so on up to any desired number of users. In addition, such sub-carrier/tone assignment may be dynamic among different respective transmissions (e.g., a first assignment for a first frame, a second assignment for second frame, etc.). An OFDM frame may include more than one OFDM symbol. Similarly, an OFDMA frame may include more than one OFDMA symbol. In addition, such sub-carrier/tone assignment may be dynamic among different respective symbols within a given frame or superframe (e.g., a first assignment for a first OFDMA symbol within a frame, a second assignment for a second OFDMA symbol within the frame, etc.). Generally speaking, an OFDMA symbol is a particular type of OFDM symbol, and general reference to OFDM symbol herein includes both OFDM and OFDMA symbols (and general reference to OFDM frame herein includes both OFDM and OFDMA frames). Generally, communication device 110 may be configured to include a processor configured to process received OFDM or OFDMA symbols and/or frames and to generate and transmit such OFDM or OFDMA symbols and/or frames, via communication interface 320, based on one or more combined codewords as described herein. In a transmission mode of operation, communication interface 320 performs processing operations of an analog front end (AFE) which may include digital to analog conversion, filtering, frequency conversion (up or down), gain adjustment and/or scaling, etc. to generate a signal operative for transmission via one or more communication channels.

With respect to FEC encoding, processor 330 combines multiple FEC codes with different codeword sizes and rates, where an (N, K) block code is defined as having a size N and a code rate K/N. K is the number of input bits (for binary codes) or input symbols (for non-binary codes) to the FEC encoder or output bits (for binary codes) or input symbols (for non-binary codes) from the FEC decoder, and N is the number of output bits or symbols from the FEC encoder or input bits or symbols to the FEC decoder. The difference is N−K parity check bits or symbols. In general, as the code size N increases, so does the code rate K/N to achieve equal robustness to noise. As such, combining multiple codes of various sizes and rates for a given combined codeword message length in a specific optimum mix provides the highest overall combined code rate, R, as a function of message length M.

FIG. 3D is a diagram illustrating an example 304 of signal demodulation and FEC decoding. In a reception mode of operation, communication interface 320 processes a signal received from a communication channel by performing processing operations of an AFE which may include digital sampling, filtering (analog and/or digital), frequency conversion (up or down), gain adjustment and/or scaling, etc. to generate a digital signal (e.g., a baseband signal) that is processed by the processor 330 to generate estimates of information bits (e.g., K information bits) encoded therein. Processor 330 performs decoding operations are performed using the similar FEC used, at least in part, to generate the signal received from a communication channel.

FIG. 4A is a diagram illustrating an example 401 of combination of multiple size, Ni, and rate, Ki/Ni, forward error correction (FEC) codewords to generate a combined codeword. In this example 401, processor 330 performs encoding using different encoders (e.g., as shown by 331 of code rate K1/N1 and 332 of code rate K2/N2 (and optionally more than two encoders up to encoder 333 of code rate Kn/Nn)). Processor 330 may include a singular encoder that is adaptive/configurable to perform encoding operations of each encoder 331-333 or may include separately implemented encoders 331-333. Each encoder 331-333 encodes a different respective number of information bits (e.g., K1, K2, and Kn bits) and generates codewords of a different respective size (e.g., N1, N2, and Nn bits). Processor 330 also performs operation of combiner 337 to generate one or more combined codewords for transmission via a communication interface of device 110.

FIG. 4B is a diagram illustrating an example 402 of codewords of different sizes and rate FECs. In example 402, processor 330 generates different respective codewords of different sizes (e.g., length N1 codewords, length N2 codewords, and, if desired, so on up to length Nn codewords). Processor 330 generates one or more combined codewords based on any desired combination of these codewords of different sizes.

FIG. 4C is a diagram illustrating an example 403 of different combined codewords of different overall lengths (diff. L's). In example 403, processor 330 generates a first combined codeword (CW 1) that includes a first combination of codewords selected from the length N1 codewords and length N2 codewords. Processor 330 also generates a second combined codeword (CW 2) that includes a second combination of codewords selected from the length N1 codewords and length N2 codewords. Processor 330 is also configured to generate a third combined codeword (CW 3) that includes a combination of codewords selected from the length N1, N2, and N3 codewords. First, second, and third combined codewords are of different lengths (diff. L's).

FIG. 4D is a diagram illustrating an example 404 of different combined codewords of a common or same overall length (same L's). In example 404, processor 330 generates a fourth combined codeword (CW 2) that includes a combination of codewords selected from the length N1 codewords (e.g., such that the length of the fourth combined codeword (CW 2) is a positive integer multiple of the first codeword size and the integer number of these length N1 codewords match a predetermined size). Processor 330 is also configured to generate a fifth combined codeword (CW 5) that includes a different combination of codewords selected from the length N1, N2, and N3 codewords. Processor 330 is also configured to generate a sixth combined codeword (CW 6) that includes yet a different combination of codewords selected from the length N1, N2, and N3 codewords. Fourth, fifth, and sixth combined codewords are of the same length (same L's) (e.g., the predetermined size).

Note that the examples 403 and 404 are not exhaustive, and processor 330 generates one or more combined codewords based on any desired combination of these codewords of different sizes (e.g., using such codewords as shown in FIG. 4B).

LDPC coding is one type of FEC code and/or ECC that may be used to generate codewords for combination to generate one or more combined codewords. Note also that different FEC codes and/or ECCs may be used to generate different types of codewords for combination to generate one or more combined codewords (e.g., a combined codeword may include different LDPC codewords, a first LDPC codeword and one other type of FEC codeword, inner and outer concatenated codes, etc.).

Processor 330 generates one or more combined codewords as described below. In an example that includes 3 separate FECs that generate 3 different types of codewords of length N1, N2, and N3, denote the number of codewords from each set, as C1, C2, and C3, chosen to form a combined codeword, M. In this example, C1 corresponds to those codewords selected from the first codewords that have the relative longest lengths (e.g., long codewords), C2 corresponds to those codewords selected from the second codewords that have the relative medium lengths (e.g., medium codewords), and C3 corresponds to those codewords selected from the third codewords that have the relative shortest lengths (e.g., short codewords). The processor 330 selects the number of codewords C1, C2, and C3, from each set of first, second, and third codewords generated by the 3 separate FECs, for each of the 3 respective codeword size N1, N2, N3 that maximizes a combined code rate, R, that is based on the 3 code rates of the 3 separate FECs as follows: $R=M/(M+C1*(N1-K1)+C2*(N2-K2)+C3*(N3-K3))$.

Maximizing the combined code rate, R, is equivalent to minimizing the number of parity bits as follows: $\min\{C1*(N1-K1)+C2*(N2-K2)+C3*(N3-K3)\}$, where $\min\{\ \}$ is minimization function.

The optimum choice for the selected codewords from each set, C1, C2, and C3, for the following relationship of coded block lengths, N1, N2, and N3: $N1>N2>N3$ and such that the code rates of the 3 separate FECs (e.g., K1/N1, K2/N2, and K3/N3) have the following relationship, $K1/N1>K2/N2>K3/N3$, for the highest rate combined code rate, R.

Processor 330 generates a combined codeword using the codewords themselves. An example of operation is provided using 3 different sized codewords: long, medium, and short. Processor 330 initially fills long codewords completely if possible. Then, processor 330 fills medium codewords, C2, completely if possible with the remaining message bits (if any) to generate second combined codeword. Then, processor 330 fills short codewords, C3, completely if possible plus another additional short codeword with the remaining message bits (if any).

If the total number of short codeword parity bits (e.g., among all of those third codewords selected, C3) is greater than or equal to the number of medium codeword parity bits (e.g., among all of those second codewords selected, C3), then processor 330 increments the number of medium codewords by one and set the number of short codewords to zero (e.g., the combined codeword then includes none of the third codewords, C3).

If the total number of medium codeword parity bits plus the total number of short codeword parity bits (e.g., among all of those second and third codewords selected, C2 and C3) is greater or equal to than the number of long codeword parity bits (e.g., among all of those first codewords selected, C1), then processor 330 increments the number of long codewords, C1, by one and set the number of medium and short codewords to zero (e.g., the combined codeword then includes none of the second and third codewords, C2 and C3).

Note also that processor 330 may be configured to determine such information in real-time and/or use certain information that is determined 'a priori' or offline. For example, processor 330 may be configured to perform direct comparison of the total number of parity bits in a resultant combined codeword to pre-calculated information, including thresholds, that can be used to determine the particular combination by which one or more of the first and second codewords are combined. This information may be stored device 110, and processor 330 is then configured to retrieve this information directly to determine the manner by which the one or more of the first and second codewords are combined. As an example, when the total number of parity bits in one possible resultant combined codeword are above a first threshold and lower than a second threshold, a first combination of one or more of the first and second codewords are combined to generate a resultant combined codeword. Alternatively, when the total number of parity bits in the possible resultant combined codeword are above the second threshold and lower than a third threshold, a second combination of one or more of the first and second codewords are combined to generate the resultant combined codeword. Processor 330 can be configured to execute the following pseudo-code (that may be stored in memory 340):

START OF PSEUDO-CODE:
/* fill long codewords completely if possible */
C1=floor(M/K1)
/ fill medium codewords completely if possible with the remaining message bits (if any) */
C2=floor((M−C1*K1)/K2)
/* fill short codewords completely if possible plus another additional short codeword with the remaining message bits (if any) */
C3=ceiling((M−C1*K1−C2*K2)/K3)
/* If the total number of short codeword parity bits is greater than or equal to the number of medium codeword parity bits */
if (C3*(N3−K3)≥N2−K2) then
 /* then increment the number of medium codewords by one and set the number of short codewords to zero */
 {C2=C2+1
 C3=0}
/* If the total number of medium codeword parity bits plus the total number of short codeword parity bits is greater than or equal to the number of long codeword parity bits */
if (C2*(N2−K2)+C3*(N3−K3)≤N1−K1) then
 /* then increment the number of long codewords by one and set the number of medium and short codewords to zero */
 {C1=C1+1
 C2=0
 C3=0}
END OF PSEUDO-CODE:

In the pseudo-code, floor( ) gives the value rounded down to the nearest integer, and ceiling( ) gives the value rounded up to the nearest integer.

Note that any desired one or more FEC codes and/or ECCs may be used to generate the two or more sets of codewords (e.g., first, second, and/or third codewords). In one embodiment, different LDPC codes having different respective characteristics (e.g., code rates, block lengths, operating on different number of input bits, etc.) are used to generate different codeword sets. Background of LDPC coding and characteristics associated with a particular type of LDPC codes, having a particular LDPC matrix structure, are provided below.

FIG. 5A illustrates an example 501 of an LDPC (Low Density Parity Check) code bipartite graph. An LDPC bipartite graph is sometimes be referred to as a "Tanner" graph. An LDPC bipartite graph is a pictorial representation of an LDPC matrix of a corresponding LDPC code, and it shows the relationship of non-null elements of the LDPC matrix that performs bit or variable edge message updating (based on columns of the LDPC matrix) and check message updating (based on rows of the LDPC matrix). An LDPC code is characterized by a binary parity check matrix (i.e., LDPC matrix) that is sparse, such that nearly all of the elements of the matrix have values of zero ("0"). For example, $H=(h_{i,j})_{M \times N}$ is a parity check matrix of an LDPC code with block length N. The LDPC bipartite graph, or "Tanner" graph, is a pictorial illustration of an LDPC matrix.

LDPC codes are linear block codes and hence the set of all codewords $x \in C$ spans the null space of a parity check matrix, H, as follows:

$$Hx^T=0, \forall x \in C \quad (1)$$

For an LDPC code, the matrix, H, is a sparse binary matrix of dimension m×n. Each row of H corresponds to a parity check and a set element $h_{ij}$ indicates that data symbol j used for the parity check i. Each column of H corresponds to a codeword symbol.

For each codeword x, there are n symbols of which m are parity symbols. Hence the code rate of the LDPC code, r, is provided as follows:

$$r=(n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

A regular LDPC code can be represented as a bipartite graph by its parity check matrix with left side nodes representing variable of the code bits (or alternatively as the "variable nodes" (or "bit nodes") 561 in a bit-based decoding of LDPC coded signals), and the right side nodes representing check equations (or alternatively as the "check nodes" 562). The bipartite graph (or Tanner graph) of the LDPC code defined by H may be defined by N variable nodes (e.g., N bit nodes) and M check nodes. Every variable node of the N variable nodes 561 has exactly $d_v(i)$ edges. As an example, edge 567 connects the bit node, $v_i$ 565, to one or more of the check nodes (within the M check nodes). The edge 567 is specifically shown as connecting from the bit node, $v_i$ 565, to the check node, $c_j$ 566. This number of $d_v$ edges (shown as $d_v$ 563) may be referred to as the degree of a variable node i. Analogously, a check node of the M check nodes 562 has $d_c(j)$ edges (shown as $d_c$ 564) connecting this node to one or more of the variable nodes (or bit nodes) 561. This number of edges, $d_c$ 564, may be referred to as the degree of the check node j.

An edge 567 between a variable node $v_i$ (or bit node $b_i$) 565 and check node $c_j$ 566 can be defined by e=(i, j). Alternatively, given an edge e=(i, j), the nodes of the edge may alternatively be denoted as by e=(v(e), c(e)) (or e=(b(e), c(e))). The edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any such codes (e.g., LDPC codes) that can be represented by a bipartite graph may be characterized as a graph code. It is also noted that an irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not be equal to $|E_v(i_2)|$. This relationship may also hold true for more than one (e.g., two) check nodes.

Note that terminology such as that of "bit node" and "bit edge message", or equivalents thereof, may be used in the art of LDPC decoding. With respect to LDPC decoding, note that "bit node" and "bit edge message" are alternatively referred to as "variable node" and "variable edge message", respectively. Note that LDPC decoding operates to make one or more estimates of the bit values (or variable values) encoded within an LDPC coded signal.

FIG. 5B illustrates an example 502 of decoding of an LDPC coded signal. Within a communication device (e.g., communication device 110), a signal received from a communication channel undergoes appropriate demodulation (e.g., processing within an analog front end including digital sampling, digital to analog conversion, filtering, frequency conversion (up or down), gain adjustment and/or scaling, etc.) to generate a received bit sequence. Then, a metric generator 571 calculates log-likelihood ratios (LLRs) for each bit location within the received bit sequence. These LLRs correspond initially to the bit nodes 561 of the LDPC code and its corresponding LDPC bipartite graph that represents the LDPC matrix used to decode the signal.

In an example of LDPC decoding, during initialization, the LLRs are employed for the bit edge messages (e.g., extrinsic information) of the edges extending from the respective bit/variable nodes. Thereafter, one or more decoding cycles or iterations may be performed based on check node processing and bit node processing (iterative decoding 572). Check node processing or check node updating is performed using the original bit edge messages (e.g., the calculated LLRs) such as by a check node processor 574. A bit/variable node processor 573 then uses these updated check edge messages to perform bit node processing or bit node updating to update the variable node soft information for use in the next decoding iteration. The most recently updated variable bit/node soft information is then used to calculate the variable node edge messages (extrinsic information) for this next decoding iteration. The check node processor 574 performs check message updating (based on rows of the LDPC matrix) to generate updated check edge messages, and the bit/variable node processor 573 performs bit or variable edge message updating (based on columns of the LDPC matrix) as also described with reference to FIG. 5A.

When more than one decoding iteration is performed, these variable node edge messages are then used by the check node processor 574 for subsequent check node processing or check node updating to calculate updated check edge messages. Then, bit/variable node processor 573 uses the most recently updated check edge messages to perform bit node processing or bit node updating to update the variable node soft information once again. After a final decoding iteration, which may be determined based on some parameter (e.g., a predetermined number of decoding iterations or when all syndromes of the LDPC code equal zero, as determined by syndrome calculator 576), the last calculated variable node soft information may undergo hard limiting (e.g., in a slicer or hard limiter 575) to generate one or more estimates of one or more bits encoded within the LDPC coded signal.

Generally speaking, this approach for decoding of LDPC coded signals may be referred to as a message passing approach (or iterative message passing approach). Note that LDPC decoding may be performed in any of a variety of architectures including parallel decoding architectures, layer decoding architectures etc. Device 110 may be implemented to perform encoding and/or decoding of LDPC coded signal using any desired approach or architecture.

Note that the various functional blocks and components depicted in FIG. 5B may be implemented or performed by the processor 330 (and memory 340) of communication device 110. For example, the processor 330 can be implemented to perform such decoding operations and the memory 340 can be implemented to store and perform memory management for the various bit/variable and check edge messages, variable bit/node soft information, extrinsic information, etc. used in the decoding operations.

FIG. 5C illustrates an example 503 of an LDPC matrix that is partitioned into sub-matrices. This diagram shows the relationship between an overall LDPC matrix and the individual sub-matrices therein that can be all zero-valued sub-matrices and/or CSI (Cyclic Shifted Identity) sub-matrices, and the diagram shows the sub-matrix rows and sub-matrix columns of the LDPC matrix that correspond to the sub-matrix arrangement of the LDPC matrix. Note also that a generator matrix, corresponding to an LDPC matrix, may be employed to encode at least one information bit to generate a plurality of LDPC coded bits and/or an LDPC codeword (e.g., such as using back-substitution described below). A generator matrix, G, of an LDPC code has the following relationship with LDPC matrix, H: $GH^T=0$. An LDPC code may be defined or characterized by its LDPC matrix, H, and/or its generator matrix, G.

A processor of a communication device (e.g., processor 330 of communication device 110) may be configured to encode at least one information bit to generate the plurality of LDPC coded bits and/or an LDPC codeword. The processor then transmits the plurality of LDPC coded bits and/or the LDPC codeword, within an LDPC coded signal via a communication interface (e.g., communication interface 320 of communication device 110). The processor may be configured to generate the LDPC coded signal by appropriate modulation of the plurality of LDPC coded bits and/or the LDPC codeword (e.g., processing within an analog front end including digital to analog conversion, filtering, frequency conversion (up or down), gain adjustment, etc.).

A binary LDPC code may be fully described by its parity check matrix (i.e., its LDPC matrix). At the top of the diagram, the individual elements of an LDPC matrix, H, are shown:

$$H = \begin{bmatrix} h_{0,0} & h_{0,1} & \cdots & h_{0,n-1} \\ h_{1,0} & h_{1,1} & \cdots & h_{1,n-1} \\ \cdots & \cdots & \cdots & \cdots \\ h_{m-1,0} & h_{m-1,1} & \cdots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $Hc^T=0$.

For such an LDPC code, the parity matrix H is also composed of a number of q-by-q (i.e., q×q) square sub-matrices as shown in the bottom portion of the diagram and also below:

$$H = \begin{bmatrix} S_{0,0} & S_{0,1} & \cdots & S_{0,N-1} \\ S_{1,0} & S_{1,1} & \cdots & S_{1,N-1} \\ \cdots & \cdots & \cdots & \cdots \\ S_{M-1,0} & S_{M-1,1} & \cdots & S_{M-1,N-1} \end{bmatrix}$$

where M=m/q, N=n/q, and each sub-matrix, $S_{I,J}$, thereof is a q-by-q sub-matrix that is either an all-zero-valued sub-matrix (i.e., in which all elements thereof are the value of zero "0", which is depicted by a blank or an empty sub-matrix or a sub-matrix with value of "−1" therein in the associated diagrams) or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j(\text{mod} q) \\ 0 & \text{otherwise} \end{cases}$$

for any i and j, with $0 \le i < q$ and $0 \le j < q$. For example, the q-by-q identity matrix is itself a CSI matrix with a shift-value $\lambda(S)=0$ (i.e., a CSI sub-matrix with a cyclic shift of zero "0").

As can be seen, the LDPC matrix (as depicted in the lower portion of the diagram), includes various sub-matrix rows and sub-matrix columns. These sub-matrix rows and columns are based on the sub-matrix construction of the LDPC matrix (e.g., shown as sub-matrix rows 0 through M−1 and sub-matrix columns 0 through N−1). This disclosure presents various new designs of LDPC codes.

Note also the following with respect to such LDPC code matrix constructions. A given LDPC code may be a QC (quasi-cyclic)-LDPC code. The definition of such an (n, k) QC-LDPC code is provided as follows:
1. (n−k)-by-n parity check matrix H
2. H is expanded from a binary base matrix $H_b$ of size v-by-u
3. The base matrix $H_b$ is expanded by replacing each sub-matrix in the base matrix with a size z permutation matrix, and each 0 with a size z zero matrix. The permutations used are circular right shifts as described above, and the set of permutation sub-matrices contains the size z identity matrix and circular right shifted versions of the identity matrix (i.e., CSI sub-matrices).

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix $H_b$ replaced to create the model matrix $H_{bm}$. Each 0 in $H_b$ is replaced by a blank or "−1"

negative to denote a size z all-zero matrix, and each other sub-matrix in $H_b$ is replaced by a circular shift size $p(i,j) \geq 0$ (e.g., an entry of "−1" indicates an all-zero-valued sub-matrix, and any other entry such as 0, 1, 2, etc. indicates an identity sub-matrix (if entry is 0), a CSI sub-matrix based on a shift-value of 1 (if entry is 1), a CSI sub-matrix based on a shift-value of 2 (if entry is 2), etc. and so on for any desired cyclic shift-value). The model matrix $H_{bm}$ can then be directly expanded to the entire LDPC matrix, H.

FIG. 6A is a diagram illustrating an example 601 of an LDPC matrix partitioned into a left hand side matrix and a right hand side matrix. The parity matrix H of the bottom of FIG. 5C may be partitioned into a left hand side matrix, $H_{LHS}$, and a right hand side matrix, $H_{RHS}$. The partitioning will be in between two sub-matrix columns. This diagram shows the partitioning being between sub-matrix column x−1 and sub-matrix column x. Left hand side matrix, $H_{LHS}$, and right hand side matrix, $H_{RHS}$, include the same number of sub-matrix rows. In one implementation, the right hand side matrix, $H_{RHS}$, is a square matrix that includes a same number of sub-matrix rows and sub-matrix columns (e.g., the right hand side matrix, $H_{RHS}$, may generally be of any size such as z-by-z, where z is any desired number such as 2, 3, 4, 5, 6, 7, or even higher numbers etc.).

FIG. 6B is a diagram illustrating examples 602 of right hand side matrices of LDPC matrices. A right hand side matrix, $H_{RHS}$, having this form is lower triangular and includes all-zero-valued sub-matrices except for CSI (Cyclic Shifted Identity) sub-matrices located on a main diagonal of the right hand side matrix and another diagonal that is adjacently located to the left of the main diagonal. Note that all of the sub-matrices are all-zero-valued sub-matrices (e.g., all elements of such sub-matrices have value of "0") expect the two adjacent diagonals (e.g., the main diagonal and another diagonal that is adjacently located to the left of the main diagonal). Also, note that these sub-matrices on these two adjacent diagonals may be based on different CSI values. A CSI value of zero indicates an identity sub-matrix. A CSI value of 1 indicates an identity sub-matrix that has undergone a cyclic shift by 1. Any desired CSI value may be employed up to the sub-matrix size, z, if considering sub-matrices of size z-by-z. Generally speaking, a CSI value of x indicates an identity sub-matrix that has undergone a cyclic shift by x.

While examples have been provided showing LDPC decoding, processor 330 can also be configured to perform encoding of bit(s) to generate LDPC coded bit(s) and/or LDPC codeword(s). Such encoding maybe performed using back-substitution. An LDPC matrix may be partitioned into a left hand side matrix, $H_{LHS}$, and a right hand side matrix, $H_{RHS}$, such as shown in FIG. 6A. The right hand side matrix, $H_{RHS}$, can have the form of any of the right hand side matrices of FIG. 6B, and may be of any desired size such as 3-by-3, 4-by-4, 5-by-5, or generally of any size such as z-by-z, where z is any desired number such as 2, 3, 4, 5, 6, 7, etc.

Considering a right hand side matrix, $H_{RHS}$, having the form of those in FIG. 6B, a CSI sub-matrix may be a respective identity matrix that has either not been cyclic shifted (and remains an identity matrix) or a respective identity matrix that has been cyclic shifted by some amount as described above. For sub-matrices of size, L-by-L, input (information) bits, $c_{in}$ (k bits=L(n−m) bits), may be represented as follows: $c_{in}(c_0, c_1, \ldots, c_{k-1})$ The processor 330 then encodes the input (information) bits and computes L·m parity bits, $c_{par}$ (e.g., LDPC coded bits) as follows: $c_{par} = (c_k, c_{k+1}, \ldots, c_{Ln-1})$ The processor 330 then outputs the following:

$$c_P^T = \begin{pmatrix} C_0 \\ C_1 \\ C_2 \\ C_3 \\ C_4 \end{pmatrix}, \text{ where}$$

$$C_i = (c_{L(n-m+i)}, c_{L(n-m+i)+1}, \ldots, c_{L(n-m+i)+L-1})^T.$$

For a right hand side matrix, $H_{RHS}$, in the form of those in FIG. 6B being of size 5-by-5 (e.g., where i varies from 0 to 4 in order of 0, 1, 2, 3, 4).

The encoding procedure may be described as follows:
Input: $c_1 = (c_0, c_1, \ldots, c_{k-1})$
Step 1: compute $V_i = H_{l,i} c_l^T$, such that $i = 0, \ldots, 4$.
Step 2: back-substitution
$C_0 = V_0(L - u_{0,0})$
$C_1 = V_1(L - u_{1,1}) + C_0 ((L - u_{1,1} + u_{1,0}) \bmod L)$
$C_2 = V_2(L - u_{2,2}) + C_1 ((L - u_{2,2} + u_{2,1}) \bmod L)$
$C_3 = V_3(L - u_{3,3}) + C_2 ((L - u_{3,3} + u_{3,2}) \bmod L)$
$C_4 = V_4(L - u_{4,4}) + C_3 ((L - u_{4,4} + u_{4,3}) \bmod L)$ $$\text{Output } c_P^T = \begin{pmatrix} C_0 \\ C_1 \\ C_2 \\ C_3 \\ C_4 \end{pmatrix}$$

FIG. 6C is a diagram illustrating an example 603 of a communication device configured to perform LDPC encoding and puncturing. A bit filler 605 operates to add one or more zero-valued bits to incoming information bits before encoding by forward error correction (FEC) encoder 620. The FEC encoder 620 processes information bits to generate coded bits. In the context of LDPC encoding, encoder 620 employs a generator matrix that is based on a given LDPC code that may also be characterized by a corresponding LDPC matrix. The LDPC matrix can have the characteristics and forms such as described with reference to FIG. 5B such that all sub-matrices of the LDPC matrix are all-zero-valued sub-matrices with the exception of those sub-matrices on the main diagonal and the other diagonal adjacently located that are CSI sub-matrices.

After FEC encoding, a shortener 625 removes those zero-valued bits that were added to the information bits before undergoing FEC encoding. Puncturer 630 punctures one or more subsets of coded bits and/or parity bits from the coded bits generated by the FEC encoder 620 and that have undergone shortening within shortener 625 to generate one or more codewords. These subsets of information bits and parity bits may be groups of contiguous bits within the coded bits. For example, a first contiguous subset of information bits (e.g., having a first period) may be punctured, and a contiguous subset of parity bits may be punctured (e.g., having the first or a second period). In other examples, more than one contiguous subset may be punctured from the coded bits (e.g., two or more contiguous subsets of information bits may be punctured, and two or more contiguous subsets of parity bits may be punctured). In even other examples, different numbers of subsets of bits may be punctured from the information bits and the parity bits (e.g., one subset of bits punctured from information bits, and to subsets of bits punctured from the parity bits). Such puncturing may be performed using different periods of bits, and/or different starting locations within the coded bits.

Transmit (TX) driver 690 processes the one or more codewords to generate one or more continuous-time signals for transmission to one or more other devices via one or more communication channels. The TX driver 690 may perform operations such as those of an analog front end (AFE) of a communication device (e.g., digital to analog conversion, filtering, frequency conversion (up or down), gain adjustment and/or scaling, etc.). Generally, the TX driver 690 operates to generate a signal suitable for transmission from the communication device. Note that the operations of the various functional blocks, components, etc. within FIG. 6A may be performed within communication device 110. For example, communication interface 320 may be configured to perform the operations of transmit (TX) driver 690. The processor 330 may be configured to perform bit filling, LDPC encoding, shortening, puncturing, and/or other related operations.

Figure 7:
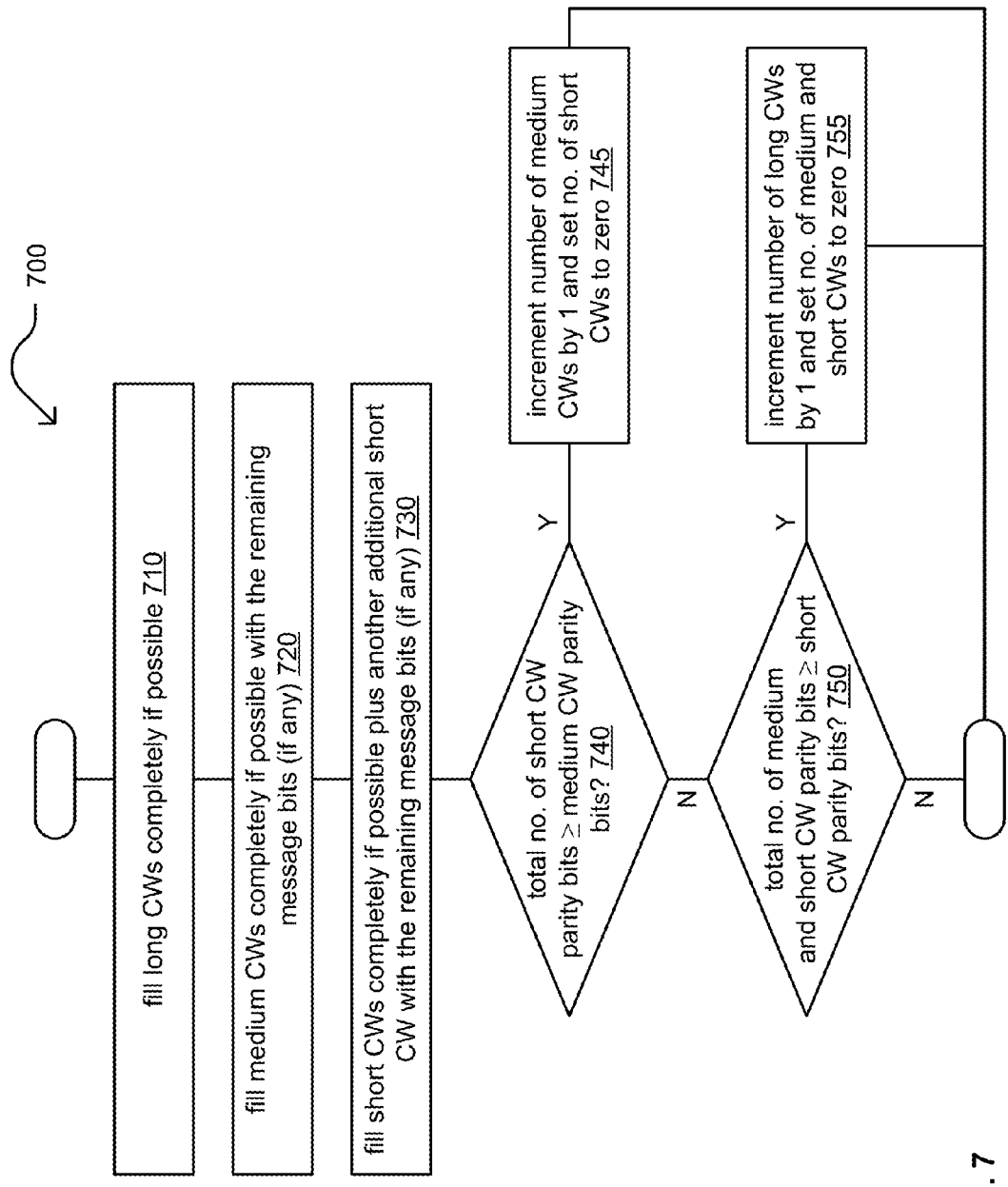
FIG. 7 is a diagram illustrating an embodiment of a method for execution by one or more communication devices.

FIG. 7 is a diagram illustrating an embodiment of a method 700 for execution by one or more communication devices. Method 700 generates a combined codeword using three separate sized codewords: long, medium, and short. Method 700 begins by initially filling long codewords completely if possible (block 710). Then, method 700 operates by filling medium codewords completely if possible with the remaining message bits (if any) (block 720). Then, method 700 operates by filling short codewords completely if possible plus another additional short codeword with the remaining message bits (if any) (block 730).

If the total number of short codeword parity bits is greater than or equal to the number of medium codeword parity bits (block 740), then method 700 operates by incrementing the number of medium codewords by one and setting the number of short codewords to zero (e.g., the combined codeword then includes none of the short codewords) (block 745).

If the total number of medium codeword parity bits plus the total number of short codeword parity bits is greater or equal to than the number of long codeword parity bits (block 750), then method 700 operates by incrementing the number of long codewords, C1, by one and setting the number of medium and short codewords to zero (e.g., the combined codeword then includes none of the short codewords) (block 755). The method then ends the encoding to generate the combined codeword (e.g., an input data burst).

An implementation of the codeword size allocation method described above can substitute a fixed threshold test for the input data burst size rather than computing the minimum total number of parity bits for a given input data burst size. The input data length thresholds for adding the next larger size codeword are determined using the method above (for either the greater than or equal to or the strictly greater than case). When the method determines the minimum number of bits in a larger shortened codeword that should be used in place of multiple smaller size full and shortened codewords for a given input data length, then that input data length so determined can be used as the threshold to test for using this larger size last shortened codeword. For the three codeword size method 700 above (e.g., that uses long, medium, and short codewords), the threshold values are determined for the minimum shortened long codeword and the minimum shortened medium codeword.

The thresholds found for either case (either the greater than or equal to or the strictly greater than case) can now be used in place of the number of parity bits in the original code rate method for encoding the input data burst with the following method.

Figure 8:
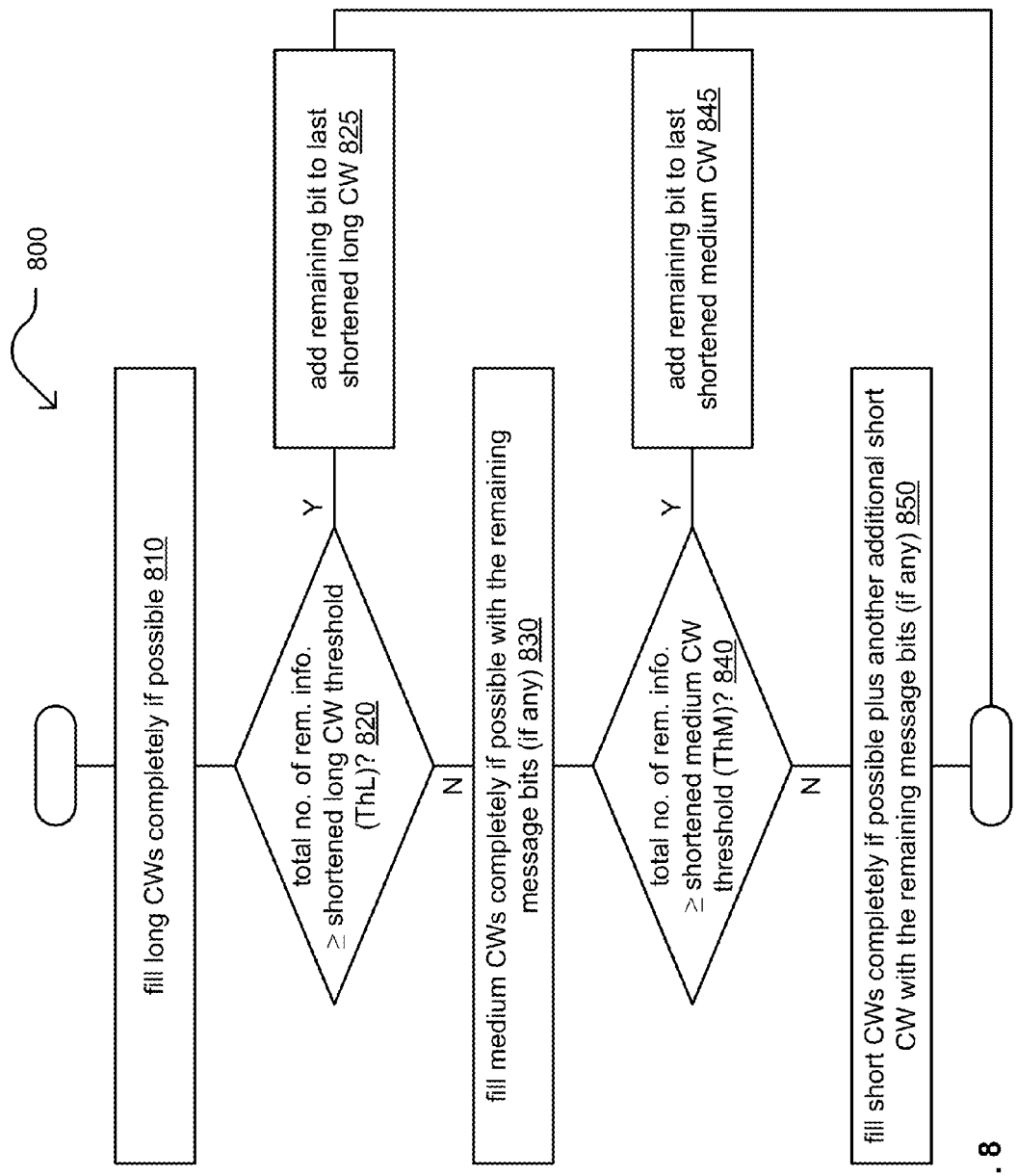
FIG. 8 is a diagram illustrating another embodiment of a method for execution by one or more communication devices.

FIG. 8 is a diagram illustrating an embodiment of a method 800 for execution by one or more communication devices. Method 800 also generates a combined codeword using three separate sized codewords: long, medium, and short.

Fill long codewords completely if possible (block 810).

If the total number of remaining information is greater than the shortened long codeword threshold (block 820), then add the remaining bits to a last shortened long codeword and end processing of the burst (block 825).

Else fill medium codewords completely if possible with the remaining message bits (if any) (block 830).

If the total number of remaining information is greater than the shortened medium codeword threshold (block 840), then add the remaining bits to a last shortened medium codeword and end processing of the burst (block 845).

Else fill short codewords completely if possible plus another additional short codeword with the remaining message bits (if any) and end processing of the burst (block 850).

The same threshold method is used for decoding a previously encoded data burst with the thresholds increased by the number of parity bits for each codeword type, and by similarly filling codewords with the codeword information plus the number of parity bits for each codeword type. The increased encoded data burst thresholds and encoded codeword sizes can be used for decoding the encoded data burst with the same method.

Figure 9:
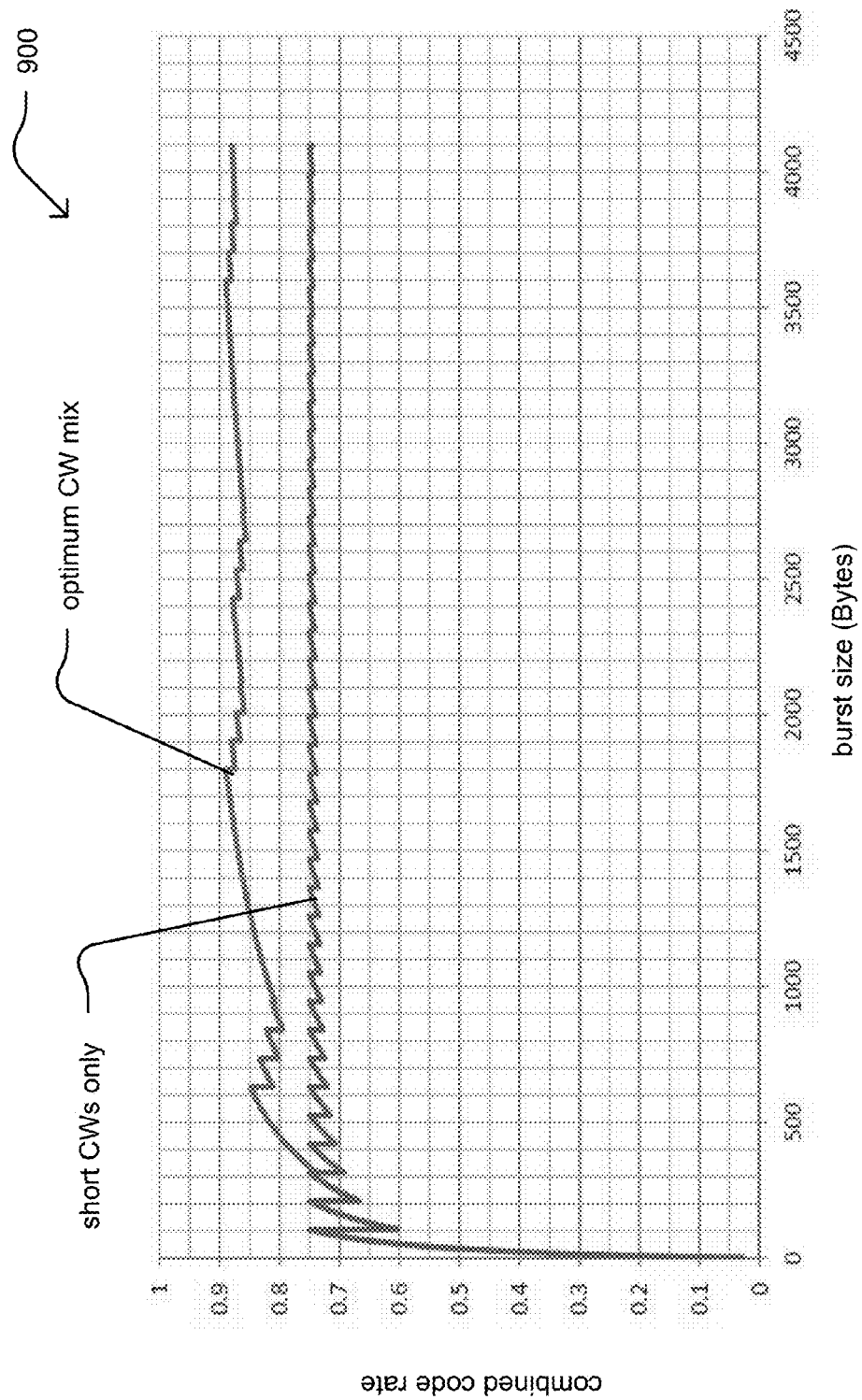
FIG. 9 is a diagram illustrating an example of combined code rate achieved by combined codewords corresponding to different information burst sizes.

FIG. 9 is a diagram illustrating an example 900 of combined code rate achieved by combined codewords corresponding to different information burst sizes. This diagram shows calculations for the number of each codeword type and the resultant combined code rate, R, using certain aspects of the combined codeword generation approach presented herein. This example 900 is based on three separate FEC codes and/or ECCs with the following characteristics: 88.9% rate Long code (16200, 14400), 84.8% rate Medium code (5940, 5040), and a 75% rate Short code (1120, 840). The resultant combined code rate R as a function of the number of message bytes is shown in the diagram. Note also that when the number of parity bits of every larger size codeword is not an integer multiple of the number of parity bits of any smaller size codeword, then a single unique solution exists for multiple size codeword mix for a given data burst size that maximizes the combined bit rate. This unique solution is given by the above defined combined codeword generation approach.

However, when the number of parity bits of every larger size codeword is an integer multiple of the number of parity bits of a smaller size codeword, then a second solution with a different codeword mix with equal combined bit rate exists. This occurs because filling a larger codeword with a given number of parity bits or filling multiple smaller codewords with the same number of total parity bits has the same combined code rate. For example, filling two smaller codewords with N parity bits each or filing a single larger codeword with 2N parity bits results in the same total number of parity bits. This yields the same overall code rate for either choice.

In this equal total parity case, the combined codeword generation approach described herein provides the solution with the larger codeword. The solution with multiple smaller codewords with equal total parity is given by modifying the approach to test for the total number of shorter codeword parity bits being strictly greater than the number of larger codeword parity bits.

Note that combined codeword generation can be reduced to two sizes of codewords (e.g., first and second), or increased to more than three sizes of codewords of multiple sizes by reduction or expansion of the operations performed by processor 330 and/or method steps described above starting with the largest size codeword, then the next largest, and so on down to the smallest size codeword available.

Another implementation of such codeword size allocation substitutes a fixed threshold test for the input data burst size rather than computing the minimum total number of parity bits for a given input data burst size. The input data length thresholds for adding the next larger size codeword are determined using the approach above (for either the greater than or equal to or the strictly greater than case). When it is determined that a larger codeword should be used in place of multiple smaller size codewords for a given input data length, then that input data length so determined can be used as the threshold to test for using this larger size codeword. For the three codeword size example above, the thresholds are determined by noting the input data length that results in a larger size shortened codeword being used instead of multiple smaller codewords. The threshold values are determined using the following approach:

$T1=0$ /* long (N1,K1) codeword threshold initialized to zero */
$T2=0$ /* medium (N2,K2) codeword threshold initialized to zero */
for M=1, K1
{
/* fill long codewords completely if possible */
C1=floor(M/K1)
/ fill medium codewords completely if possible with the remaining message bits (if any) */
C2=floor((M−C1*K1)/K2)
/* fill short codewords completely if possible plus another additional short codeword with the remaining message bits (if any) */
C3=ceiling((M−C1*K1−C2*K2)/K3)
/* If the total number of short codeword parity bits is greater than or equal to the number of medium codeword parity bits */
if (C3*(N3−K3)≥N2−K2) then
    /* then increment the number of medium codewords by one and set the number of short codewords to zero */
    {C2=C2+1
    C3=0
    /* set the threshold to the minimum shortened medium codeword information size */
    if (T2=0) then T2=M−1}
/* If the total number of medium codeword parity bits plus the total number of short codeword parity bits is greater than or equal to the number of long codeword parity bits */
if (C2*(N2−K2)+C3*(N3−K3)≥N1−K1) then
    /* then increment the number of long codewords by one and set the number of medium and short codewords to zero */
    {C1=C1+1
    C2=0
    C3=0
    /* set the threshold to the minimum shortened long codeword information size */
    if (T1=0) then T1=M−1}
}

As previously discussed, when the number of parity bits of every larger size codeword is an integer multiple of the number of parity bits of a smaller size codeword, then a second solution with a different codeword mix with equal combined bit rate exists. This yields the same overall code rate for either choice. In this equal total parity case, the approach above will give the solution with the larger codeword. The solution with multiple smaller codewords with equal total parity is given by modifying the approach to test for the total number of shorter codeword parity bits being strictly greater than the number of larger codeword parity bits. The thresholds found above for either case (either the greater than or equal to or the strictly greater than case) can now be used in place of the number of parity bits in the original code rate approach for encoding the input data burst as follows:

/* fill long codewords completely if possible */
C1=floor(M/K1)
/ fill medium codewords completely if possible with the remaining message bits (if any) */
C2=floor((M−C1*K1)/K2)
/* fill short codewords completely if possible plus another additional short codeword with the remaining message bits (if any) */
C3=ceiling((M−C1*K1−C2*K2)/K3)
/* If the total number of medium codeword information bits plus the total number of short codeword information bits is greater than the long shortened codeword threshold */
if (M−C1*K1>T1) then
    /* then increment the number of long codewords by one and set the number of medium and short codewords to zero */
    {C1=C1+1
    C2=0
    C3=0}
/* Else if the total number of short codeword information bits is greater than the medium shortened codeword threshold */
else (M−C1*K1−C2*K2>T2) then
    /* then increment the number of medium codewords by one and set the number of short codewords to zero */
    {C2=C2+1
    C3=0}

Calculations have been performed for the number of each codeword type and the resultant combined code rate R using this threshold approach for the three previously defined codes. The results are identical to the previous Optimum Mixed Rate approach.

When the input data burst of length M is encoded with the number of codewords of each type using the threshold approach, then the number of codewords of each type can be determined given the encoded input data burst of length $N=M+C1*(N1−K1)+C2*(N2−K2)+C3*(N3−K3)$. The same threshold approach is used with the thresholds T1' and T2' which are the input data bit thresholds increased by the number of parity bits for each codeword type, that is: $T1'=T1+(N1−K1)$ and $T2'=T2+(N2−K2)$ and with the codeword information size K1, K2, and K3 similarly increased by the number of parity bits for each codeword type N1, N2, and N3.

The increased encoded data burst thresholds and codeword sizes can be used for decoding the encoded data burst as follows:

/* fill long codewords completely if possible */
C1=floor(N/N1)
/ fill medium codewords completely if possible with the remaining message bits (if any) */
C2=floor((N−C1*N1)/N2)
/* fill short codewords completely if possible plus another additional short codeword with the remaining message bits (if any) */
C3=ceiling((N−C1*N1−C2*N2)/N3)
/* If the total number of medium codeword information bits plus the total number of short codeword information bits is greater than the long shortened codeword threshold */ if (N−C1*N1>T1') then
/* then increment the number of long codewords by one and set the number of medium and short codewords to zero */
{C1=C1+1
C2=0
C3=0}
/* If the total number of short codeword information bits is greater than the medium shortened codeword threshold */
if (N−C1*N1−C2*N2>T2') then
/* then increment the number of medium codewords by one and set the number of short codewords to zero */
{C2=C2+1
C3=0}

Calculations have been performed for the number of each codeword type and the resultant combined code rate R using this threshold based decoding approach for the three previously defined codes. The results are identical to the previous Optimum Mixed Rate and Encode Threshold approach. Thus decoding of an encoded data burst is uniquely reversible.

Note that, in some situations, the last shortened codeword may contain relatively very few message bits, or even a single bit. Processor 330 may transmit such a last shortened codeword, via communication interface 320, in a much shorter time than a full codeword. As such, a receiver device will need to decode such a received shortened codeword in a shortened time equal to the reduced transmission time. In some embodiments, a receiver device's processor may be configured to decode in a manner that is operative at a much higher speed (and power) for this minimum size shortened codeword.

In certain embodiments, the combined codeword generation approach presented herein may be modified to include an additional step that includes, upon completion of filling the last shortened codeword, a check is made to determine if this combined codeword is at least half full of information bits. This check is to determine if the last codeword contains at least K/2 information bits (e.g., when K information bits are included in the combined codeword). If not, then the process operates to move those K/2 information bits from the next-to-last codeword into the shortened last codeword. This results in the two last shortened codewords being at least half full. This limits the maximum decoding speed for a shortened codeword to less than twice that of a full codeword of the same type. Note that since moving these bits from one codeword to another maintains the number of total message bits and the total number of parity bits, this does not change the combined code rate thus maintains the optimum efficiency and maximizes the combined code rate.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to," "operably coupled to," "coupled to," and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably" or equivalent, indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module," "processing circuit," "processor," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
a communication interface; and
a processor configured to:
    encode first information using a first code having a first code rate to generate first codewords having a first size;
    shorten the first codewords to generate first shortened codewords having a first shortened size;
    encode second information using a second code having a second code rate to generate second codewords having a second size that is less than the first size;
    shorten the second codewords to generate second shortened codewords having a second shortened size;
    encode third information using a third code having a third code rate to generate third codewords having a third size that is less than the second size;
    shorten the third codewords to generate third shortened codewords having a third shortened size;
    generate an orthogonal frequency division multiple access (OFDMA) frame that includes a combined codeword having a predetermined size;
    generate the combined codeword using a first subset of the first codewords when the predetermined size is a positive integer multiple of the first size; and
    generate, when the predetermined size is not the positive integer multiple of the first size, the combined codeword using a second subset of the first codewords that fill the predetermined size as completely as possible within the predetermined size that leaves one or more remaining message bits within the predetermined size and fill at least one of the first shortened codewords, the second codewords, the second shortened codewords, the third codewords, or the third shortened codewords within the one or more remaining message bits; and
    transmit, via the communication interface, the OFDMA frame to another communication device.

2. The communication device of claim 1, wherein the processor is further configured to:
    generate, when the predetermined size is not the positive integer multiple of the first size, the combined codeword using the second subset of the first codewords and a first subset of the first shortened codewords when the one or more remaining message bits is greater than or equal to a positive integer multiple of the first shortened size.

3. The communication device of claim 1, wherein the processor is further configured to:
    generate, when the predetermined size is not the positive integer multiple of the first size, the combined codeword using the second subset of the first codewords and at least one of the first shortened codewords followed by at least one of the second codewords, the second shortened codewords, the third codewords, or the third shortened codewords within the one or more remaining message bits.

4. The communication device of claim 1, wherein the processor is further configured to:
    generate, when the predetermined size is not the positive integer multiple of the first size, the combined codeword using the second subset of the first codewords and at least one of the first shortened codewords followed by at least one of the second codewords followed by at least one of the second shortened codewords, the third codewords, or the third shortened codewords within the one or more remaining message bits.

5. The communication device of claim 1, wherein the processor is further configured to:
  generate, when the predetermined size is not the positive integer multiple of the first size, the combined codeword using the second subset of the first codewords and at least one of the first shortened codewords followed by at least one of the second codewords followed by at least one of the second shortened codewords followed by at least one of the third codewords or the third shortened codewords within the one or more remaining message bits.

6. The communication device of claim 1, wherein the processor is further configured to generate the combined codeword by:
  filling the combined codeword with the first codewords as completely as possible;
  when the combined codeword includes the one or more remaining message bits after filling the combined codeword with the first codewords as completely as possible, filling the combined codeword with the second codewords as completely as possible;
  when the combined codeword includes additional one or more remaining message bits after filling the combined codeword with the second codewords as completely as possible, filling the combined codeword with the third codewords as completely as possible;
  when parity bits generated by the second code are greater than or equal to parity bits generated by the first code within the combined codeword, modify the combined codeword by increasing a number of the second codewords by one and excluding any third codewords from the combined codeword; and
  when parity bits generated by the second code and the third code are greater than or equal to parity bits generated by the first code within the combined codeword, modify the combined codeword by increasing a number of the first codewords by one and excluding any second and third codewords from the combined codeword.

7. The communication device of claim 1, wherein the processor is further configured to:
  encode the first information that includes 14440 information bits using the first code having the first code rate of 14400/16200 to generate the first codewords having the first size that is 16200 bits including the 14440 information bits;
  encode the second information that includes 5040 information bits using the second code having the second code rate of 5040/5940 to generate the second codewords having the second size that is 5940 bits including the 5040 information bits; and
  encode the third information that includes 840 information bits using the third code having the third code rate of 840/1120 to generate the third codewords having the third size that is 1120 bits including the 840 information bits.

8. The communication device of claim 1, wherein the processor is further configured to perform encoding using:
  the first code that is based on a first low density parity check (LDPC) code that is characterized by a first LDPC matrix that includes a first plurality of sub-matrices, wherein a first right hand side matrix of the first plurality of sub-matrices is lower triangular and includes all-zero-valued sub-matrices except for first CSI (Cyclic Shifted Identity) sub-matrices located on a main diagonal of the first right hand side matrix and another diagonal that is adjacently located to left of the main diagonal of the first right hand side matrix;
  the second code that is based on a second LDPC code that is characterized by a second LDPC matrix that includes a second plurality of sub-matrices, wherein a second right hand side matrix of the second plurality of sub-matrices is lower triangular and includes all-zero-valued sub-matrices except for second CSI sub-matrices located on a main diagonal of the second right hand side matrix and another diagonal that is adjacently located to left of the main diagonal of the second right hand side matrix; and
  the third code that is based on a third LDPC code that is characterized by a third LDPC matrix that includes a third plurality of sub-matrices, wherein a third right hand side matrix of the third plurality of sub-matrices is lower triangular and includes all-zero-valued sub-matrices except for third CSI sub-matrices located on a main diagonal of the third right hand side matrix and another diagonal that is adjacently located to left of the main diagonal of the third right hand side matrix.

9. The communication device of claim 1, wherein the communication interface is further configured to:
  support communications within at least one of a satellite communication system, a wireless communication system, a wired communication system, a fiber-optic communication system, or a mobile communication system.

10. A communication device comprising:
  a communication interface; and
  a processor configured to:
    encode first information using a first code having a first code rate to generate first codewords having a first size;
    encode second information using a second code having a second code rate to generate second codewords having a second size that is less than the first size;
    encode third information using a third code having a third code rate to generate third codewords having a third size that is less than the second size;
    generate an orthogonal frequency division multiple access (OFDMA) frame that includes a combined codeword having a predetermined size;
    generate the combined codeword using a first subset of the first codewords when the predetermined size is a positive integer multiple of the first size;
    generate, when the predetermined size is not the positive integer multiple of the first size, the combined codeword using a second subset of the first codewords that fill the predetermined size as completely as possible within the predetermined size that leaves one or more remaining message bits within the predetermined size and fill at least one of the second codewords, or the third codewords within the one or more remaining message bits; and
    transmit, via the communication interface, the OFDMA frame to another communication device.

11. The communication device of claim 10, wherein the processor is further configured to:
  shorten the first codewords to generate first shortened codewords having a first shortened size;
  shorten the second codewords to generate second shortened codewords having a second shortened size;
  shorten the third codewords to generate third shortened codewords having a third shortened size; and
  generate, when the predetermined size is not the positive integer multiple of the first size, the combined codeword using the second subset of the first codewords that fill the predetermined size as completely as possible within the predetermined size that leaves one or more remaining message bits within the predetermined size and fill at least one of the first shortened codewords, the second codewords, the second shortened codewords, the third codewords, or the third shortened codewords within the one or more remaining message bits.

12. The communication device of claim 10, wherein the processor is further configured to:
encode the first information that includes 14440 information bits using the first code having the first code rate of 14400/16200 to generate the first codewords having the first size that is 16200 bits including the 14440 information bits;
encode the second information that includes 5040 information bits using the second code having the second code rate of 5040/5940 to generate the second codewords having the second size that is 5940 bits including the 5040 information bits; and
encode the third information that includes 840 information bits using the third code having the third code rate of 840/1120 to generate the third codewords having the third size that is 1120 bits including the 840 information bits.

13. The communication device of claim 10, wherein the processor is further configured to perform encoding using:
the first code that is based on a first low density parity check (LDPC) code that is characterized by a first LDPC matrix that includes a first plurality of sub-matrices, wherein a first right hand side matrix of the first plurality of sub-matrices is lower triangular and includes all-zero-valued sub-matrices except for first CSI (Cyclic Shifted Identity) sub-matrices located on a main diagonal of the first right hand side matrix and another diagonal that is adjacently located to left of the main diagonal of the first right hand side matrix;
the second code that is based on a second LDPC code that is characterized by a second LDPC matrix that includes a second plurality of sub-matrices, wherein a second right hand side matrix of the second plurality of sub-matrices is lower triangular and includes all-zero-valued sub-matrices except for second CSI sub-matrices located on a main diagonal of the second right hand side matrix and another diagonal that is adjacently located to left of the main diagonal of the second right hand side matrix; and
the third code that is based on a third LDPC code that is characterized by a third LDPC matrix that includes a third plurality of sub-matrices, wherein a third right hand side matrix of the third plurality of sub-matrices is lower triangular and includes all-zero-valued sub-matrices except for third CSI sub-matrices located on a main diagonal of the third right hand side matrix and another diagonal that is adjacently located to left of the main diagonal of the third right hand side matrix.

14. The communication device of claim 10, wherein the communication interface is further configured to:
support communications within at least one of a satellite communication system, a wireless communication system, a wired communication system, a fiber-optic communication system, or a mobile communication system.

15. A method for execution by a communication device, the method comprising:
encoding first information using a first code having a first code rate to generate first codewords having a first size;
encoding second information using a second code having a second code rate to generate second codewords having a second size that is less than the first size;
encoding third information using a third code having a third code rate to generate third codewords having a third size that is less than the second size;
encoding an orthogonal frequency division multiple access (OFDMA) frame that includes a combined codeword having a predetermined size;
generating the combined codeword using a first subset of the first codewords when the predetermined size is a positive integer multiple of the first size; and
generating, when the predetermined size is not the positive integer multiple of the first size, the combined codeword using a second subset of the first codewords that fill the predetermined size as completely as possible within the predetermined size that leaves one or more remaining message bits within the predetermined size and fill at least one of the second codewords, or the third codewords within the one or more remaining message bits; and
transmitting, via a communication interface of the communication device, the OFDMA frame to another communication device.

16. The method of claim 15 further comprising:
shortening the first codewords to generate first shortened codewords having a first shortened size;
shortening the second codewords to generate second shortened codewords having a second shortened size;
shortening the third codewords to generate third shortened codewords having a third shortened size; and
generating, when the predetermined size is not the positive integer multiple of the first size, the combined codeword using the second subset of the first codewords that fill the predetermined size as completely as possible within the predetermined size that leaves one or more remaining message bits within the predetermined size and fill at least one of the first shortened codewords, the second codewords, the second shortened codewords, the third codewords, or the third shortened codewords within the one or more remaining message bits.

17. The method of claim 16 further comprising:
generating, when the predetermined size is not the positive integer multiple of the first size, the combined codeword using the second subset of the first codewords and a first subset of the first shortened codewords when the one or more remaining message bits is greater than or equal to a positive integer multiple of the first shortened size.

18. The method of claim 16 further comprising:
generate, when the predetermined size is not the positive integer multiple of the first size, the combined codeword using the second subset of the first codewords and at least one of the first shortened codewords followed by at least one of the second codewords followed by at least one of the second shortened codewords followed by at least one of the third codewords or the third shortened codewords within the one or more remaining message bits.

19. The method of claim 15 further comprising:
encode the first information that includes 14440 information bits using the first code having the first code rate of 14400/16200 to generate the first codewords having the first size that is 16200 bits including the 14440 information bits;
encode the second information that includes 5040 information bits using the second code having the second code rate of 5040/5940 to generate the second codewords having the second size that is 5940 bits including the 5040 information bits; and encode the third information that includes 840 information bits using the third code having the third code rate of 840/1120 to generate the third codewords having the third size that is 1120 bits including the 840 information bits.

20. The method of claim 15 further comprising performing encoding using:
- the first code is based on a first low density parity check (LDPC) code that is characterized by a first LDPC matrix that includes a first plurality of sub-matrices, wherein a first right hand side matrix of the first plurality of sub-matrices is lower triangular and includes all-zero-valued sub-matrices except for first CSI (Cyclic Shifted Identity) sub-matrices located on a main diagonal of the first right hand side matrix and another diagonal that is adjacently located to left of the main diagonal of the first right hand side matrix;
- the second code is based on a second LDPC code that is characterized by a second LDPC matrix that includes a second plurality of sub-matrices, wherein a second right hand side matrix of the second plurality of sub-matrices is lower triangular and includes all-zero-valued sub-matrices except for second CSI sub-matrices located on a main diagonal of the second right hand side matrix and another diagonal that is adjacently located to left of the main diagonal of the second right hand side matrix; and
- the third code is based on a third LDPC code that is characterized by a third LDPC matrix that includes a third plurality of sub-matrices, wherein a third right hand side matrix of the third plurality of sub-matrices is lower triangular and includes all-zero-valued sub-matrices except for third CSI sub-matrices located on a main diagonal of the third right hand side matrix and another diagonal that is adjacently located to left of the main diagonal of the third right hand side matrix.

\* \* \* \* \*